US 9,985,433 B2

(12) United States Patent
Takada

(10) Patent No.: US 9,985,433 B2
(45) Date of Patent: May 29, 2018

(54) OUTPUT CIRCUIT

(71) Applicant: KABUSHIKI KAISHA TOSHIBA, Tokyo (JP)

(72) Inventor: Shuichi Takada, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 396 days.

(21) Appl. No.: 14/638,359

(22) Filed: Mar. 4, 2015

(65) Prior Publication Data

US 2015/0263505 A1    Sep. 17, 2015

(30) Foreign Application Priority Data

Mar. 12, 2014    (JP) .................... 2014-049051

(51) Int. Cl.
    *H02H 3/20* (2006.01)
    *H02H 9/04* (2006.01)
    *H01L 27/02* (2006.01)

(52) U.S. Cl.
    CPC ......... *H02H 9/046* (2013.01); *H01L 27/0251* (2013.01); *H02H 3/20* (2013.01)

(58) Field of Classification Search
    CPC .................. H02H 9/046; H02H 3/20
    See application file for complete search history.

(56) References Cited

U.S. PATENT DOCUMENTS

| 5,311,391 | A | 5/1994 | Dungan et al. |
| 6,385,021 | B1 | 5/2002 | Takeda et al. |
| 6,686,779 | B2 | 2/2004 | Yoshikawa |
| 6,867,461 | B1* | 3/2005 | Ker .................. H01L 27/0251 257/360 |
| 6,970,336 | B2 | 11/2005 | Stockinger et al. |
| 7,746,609 | B2 | 6/2010 | Kim |
| 8,164,872 | B2 | 4/2012 | Suzuki |
| 8,427,798 | B2 | 4/2013 | Shimomura et al. |
| 8,493,698 | B2 | 7/2013 | Morishita |
| 2003/0042940 | A1 | 3/2003 | Yoshikawa |
| 2004/0145392 | A1 | 7/2004 | Yoshikawa |
| 2005/0078419 | A1 | 4/2005 | Stockinger et al. |
| 2006/0181823 | A1* | 8/2006 | Miller ................ H01L 27/0292 361/56 |

(Continued)

FOREIGN PATENT DOCUMENTS

| JP | H02-1608 | 1/1990 |
| JP | H06-334443 | 12/1994 |

(Continued)

*Primary Examiner* — Zeev V Kitov

(74) *Attorney, Agent, or Firm* — Patterson & Sheridan, LLP

(57) ABSTRACT

According to one embodiment, there is provided an open-drain-type output circuit which outputs a signal of an internal circuit. The output circuit includes a first signal output terminal, a first signal line, a first floating line, a first rectifier element, and a first ESD protection circuit. The first signal line connects the first signal output terminal and the internal circuit. Potential of the first floating line is not fixed. The first rectifier element is connected between the first signal output terminal and the first floating line. The first ESD protection circuit is connected between the first floating line and ground potential.

19 Claims, 7 Drawing Sheets

(56) References Cited

U.S. PATENT DOCUMENTS

| | | | |
|---|---|---|---|
| 2010/0214704 A1* | 8/2010 | Lamey | ............... H01L 27/0255 |
| | | | 361/56 |
| 2010/0246079 A1 | 9/2010 | Suzuki | |
| 2013/0057993 A1 | 3/2013 | Fukasaku | |
| 2013/0148243 A1 | 6/2013 | Tsujikawa | |
| 2014/0247525 A1* | 9/2014 | Parks | ................ H03K 19/1732 |
| | | | 361/56 |

FOREIGN PATENT DOCUMENTS

| | | |
|---|---|---|
| JP | 2003-152523 | 5/2003 |
| JP | 2003-530698 | 10/2003 |
| JP | 2007-511898 | 5/2007 |
| JP | 2007-142423 A | 6/2007 |
| JP | 2007-227697 A | 9/2007 |
| JP | 2007-250981 | 9/2007 |
| JP | 2008-218825 | 9/2008 |
| JP | 2010-239046 | 10/2010 |
| JP | 2010-278109 A | 12/2010 |
| JP | 2011-228372 A | 11/2011 |
| JP | 2013-055102 A | 3/2013 |
| JP | 2013-120815 A | 6/2013 |

\* cited by examiner

OUTPUT CIRCUIT

CROSS-REFERENCE TO RELATED APPLICATIONS

This application is based upon and claims the benefit of priority from Japanese Patent Application No. 2014-049051, filed on Mar. 12, 2014; the entire contents of which are incorporated herein by reference.

FIELD

Embodiments described herein relate generally to an output circuit.

BACKGROUND

If an ESD occurs in a semiconductor device and a surge current (ESD current) due to the ESD goes into the internal circuit via an output circuit, then a high voltage greater than the tolerable value may be applied to the internal circuit, resulting in destroying the internal circuit. Accordingly, it is desired to secure a discharge path for ESD in output circuits so as to protect the internal circuit.

DETAILED DESCRIPTION

In general, according to one embodiment, there is provided an open-drain-type output circuit which outputs a signal of an internal circuit. The output circuit includes a first signal output terminal, a first signal line, a first floating line, a first rectifier element, and a first ESD protection circuit. The first signal line connects the first signal output terminal and the internal circuit. Potential of the first floating line is not fixed. The first rectifier element is connected between the first signal output terminal and the first floating line. The first ESD protection circuit is connected between the first floating line and ground potential.

Exemplary embodiments of output circuit will be explained below in detail with reference to the accompanying drawings. The present invention is not limited to the following embodiments.

Embodiment

Figure 7:
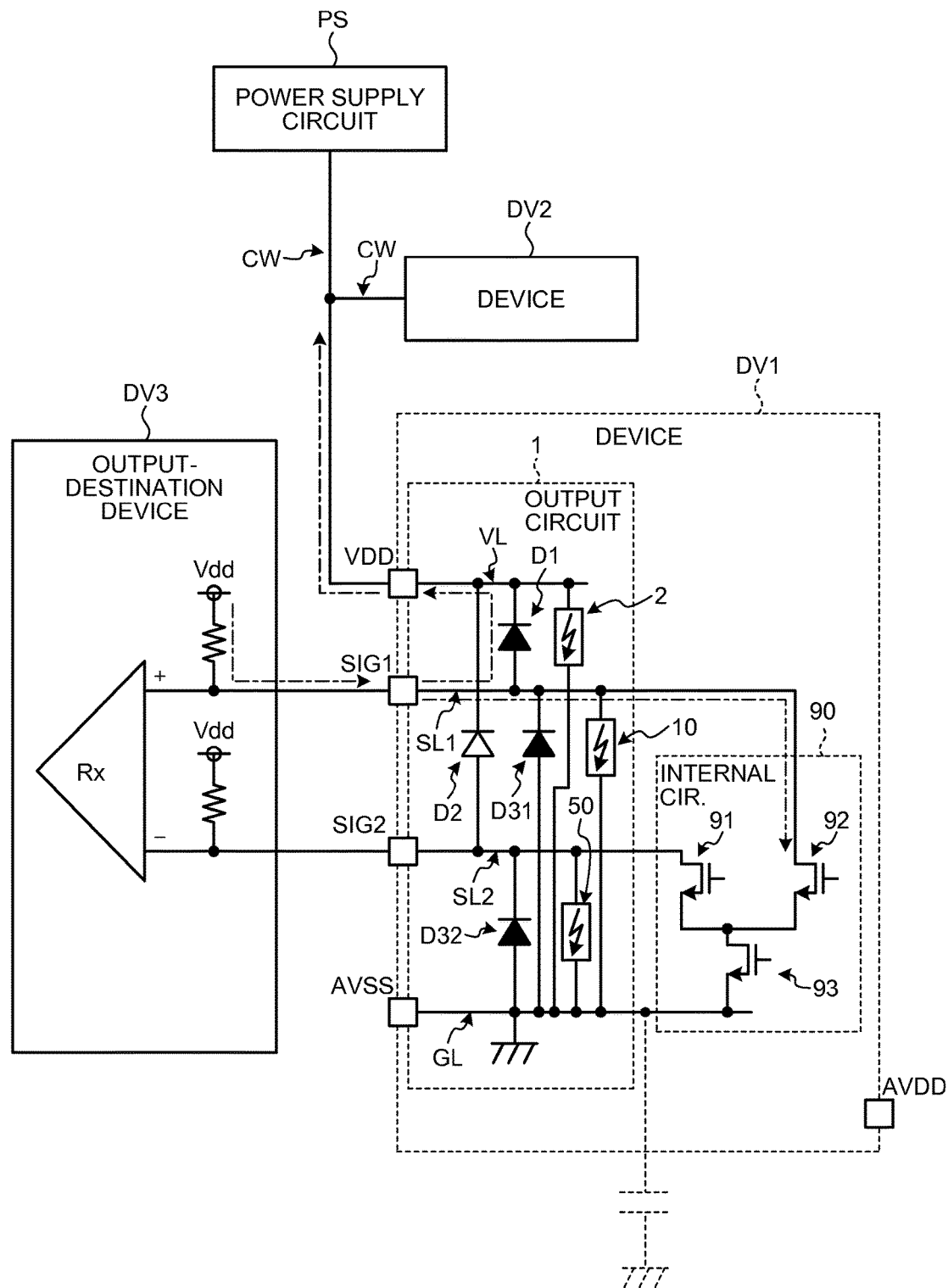
FIG. 7 is a diagram showing the configuration of an output circuit according to a basic form.

Before the output circuit 100 according to the embodiment is described, an output circuit 1 according to a basic form will be described using FIG. 7. FIG. 7 is a diagram showing the configuration of the output circuit 1 according to a basic form.

The output circuit 1 is incorporated together with an internal circuit 90 in a device DV1. The output circuit 1 is an open-drain-type high speed differential output circuit and outputs a signal (differential signal) of the internal circuit 90 to an output-destination device DV3. The device DV1 is, for example, a DVD player or a mobile portable device, and the output-destination device DV3 is, for example, a television set.

The output circuit 1 includes a protection circuit against ESD (Electrostatic Discharge). That is, the output circuit 1 has a signal output terminal (first signal output terminal) SIG1, a signal output terminal (second signal output terminal) SIG2, a power supply terminal VDD, a ground terminal AVSS, a signal line (first signal line) SL1, a signal line (second signal line) SL2, a ground line GL, a power supply line VL, a rectifier element D1, a rectifier element D2, a rectifier element (third rectifier element) D31, a rectifier element D32, a diode triggered thyristor 2, a diode triggered thyristor 10, and a diode triggered thyristor 50. The signal output terminals SIG1 and SIG2 form a differential pair. One ends of the signal lines SL1, SL2 are respectively connected via the signal output terminals SIG1, SIG2 to pull-up resistors in the output-destination device DV3. Elements 91, 92 of the internal circuit 90 include, for example, open-drain-type NMOS transistors together forming a differential pair. The other ends of the signal lines SL1, SL2 are respectively connected to the drains of the elements 92, 91 (NMOS transistors).

For the protection of the output circuit 1 against ESD, the power supply line VL is connected to a power supply terminal VDD; the rectifier element D1 (e.g., a diode) is connected between the signal output terminal SIG1 and the power supply line VL; and the diode triggered thyristor 2 is connected between the power supply line VL and the ground line GL. This is intended to secure a discharge path for surge current (positive ESD current) due to ESD entering from the signal output terminal SIG1. Further, the rectifier element D2 (e.g., a diode) is connected between the signal output terminal SIG2 and the power supply line VL. This is intended to secure a discharge path for ESD current entering from the signal output terminal SIG2. The rectifier elements D31, D32 are provided to secure discharge paths for surge current (negative ESD current) due to ESD and flowing out via the signal output terminals SIG1, SIG2.

However, as the internal circuit 90, an electronic circuit can be used which can operate with power supply via a power supply terminal AVDD for a lower voltage (e.g., 1.5 V or 1.0 V), not with power supply via the power supply terminal VDD for a high voltage (e.g., 5 V, 3.3 V, or 2.5 V). In this case, providing the high-voltage power supply terminal VDD for the purpose of I/O protection would result in a wasteful increase in the cost of the output circuit 1.

Further, in the configuration shown in FIG. 7, a power supply circuit PS is connected to the power supply terminal VDD via a connection wire CW, and another device DV2 may be connected to the connection wire CW. That is, if it is intended to secure a discharge path with use of the rectifier elements D1, D2 and the diode triggered thyristor 2, when the output-destination device DV3 is connected to the device DV1, an unnecessary current may flow through the connection wire CW as indicated by a dot-dashed line in FIG. 7. That is, an unnecessary current entering from a power supply potential Vdd of the output-destination device DV3 through the signal output terminal SIG1 may flow via the rectifier element D1 and the power supply terminal VDD through the connection wire CW. Hence, when power supply by the power supply circuit PS to the devices DV1, DV2 is off, the potential on the connection wire CW is raised, and thus the device DV2 may malfunction.

In order to avoid this problem, the protection of the output circuit 1 against ESD is performed mainly by the diode triggered thyristors 10 and 50 if the power supply terminal VDD and the rectifier elements D1, D2 are omitted from the configuration shown in FIG. 7.

However, in order to make these protection elements have enough protection against ESD, the area of the diffusion region needs to be enlarged, and hence their parasitic capacitance tends to be too large for use in high-speed, higher than 1 GHz, signal terminals. That is, because the diode triggered thyristors 10 and 50 have the structure where two bipolar transistors are connected to form a thyristor and where multiple diodes are connected in series to each of its anode side and cathode side, their parasitic capacitance is very large. Therefore, the transmission delay of a signal on the signal line SL1 is likely to be large because of the parasitic capacitance of the diode triggered thyristor 10 when seen from the signal line SL1, and the transmission delay of a signal on the signal line SL2 is likely to be large because of the parasitic capacitance of the diode triggered thyristor 50 when seen from the signal line SL2, and hence it is difficult to secure the transmission speed of a differential signal across the signal lines SL1 and SL2.

For ESD, there are three main analytic models: HBM (Human Body Model), MM (Machine Model), and CDM (Charged Device Model). The MM and the CDM each model static electricity which occurs in the production processes of electronic devices assuming being electrically charged, e.g., in transporting a printed-circuit board, when taking an LSI out of packaging material, or so on. The HBM models static electricity which occurs in an environment where a user uses an electronic device assuming being electrically charged, e.g., when touching an exposed terminal by the hand, or so on. In the CDM of these, the rising rate in the waveform of surge current (positive or negative ESD current) is very quick.

That is, if it is intended to secure discharge paths with use of with the diode triggered thyristors 10 and 50, because their response speed is slow for CDM current, the CDM current (a high speed pulse) may enter the internal circuit 90 as indicated by a two-dot chain line in FIG. 7 to destroy the elements 91 to 93 in the internal circuit 90.

Figure 1:
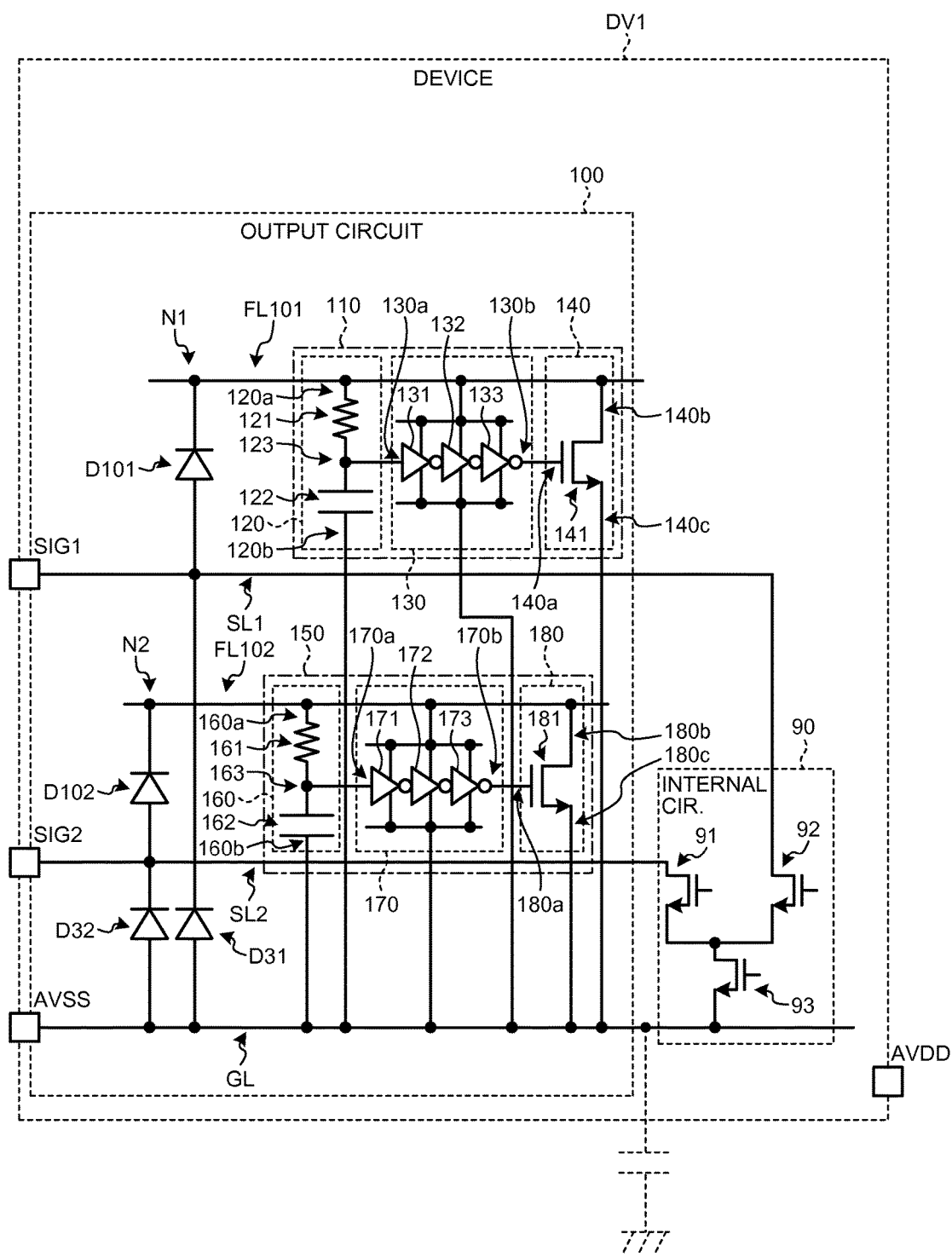
FIG. 1 is a diagram showing the configuration of an output circuit according to an embodiment.

Accordingly, in the present embodiment, it is intended to make the output circuit 100 quickly respond to high speed pulses like CDM currents by securing discharge paths through rectifier elements D101, D102, floating lines FL101, FL102, and ESD protection circuits (RCTMOS) 110, 150 as shown in FIG. 1. FIG. 1 is a diagram showing the configuration of the output circuit 100. Description will be made below focusing on the differences from the basic form.

Specifically, the output circuit 100 does not have the power supply terminal VDD and the power supply line VL (see FIG. 7). The output circuit 100 has the rectifier element (first rectifier element) D101, the rectifier element (second rectifier element) D102, the floating line (first floating line) FL101, the floating line (second floating line) FL102, the ESD protection circuit (first ESD protection circuit) 110, and the ESD protection circuit (second ESD protection circuit) 150 instead of the rectifier element D1, the rectifier element D2, the diode triggered thyristor 2, the diode triggered thyristor 10, and the diode triggered thyristor 50 (see FIG. 7).

The rectifier element D101 is provided so as to rectify in the direction in which to allow current to flow from the signal output terminal SIG1 to the floating line FL101. The rectifier element D101 is electrically connected between the signal output terminal SIG1 and the floating line FL101. The rectifier element D101 is, for example, a diode and has its cathode connected to the floating line FL101 and its anode connected to the signal line SL1. The rectifier element D101 is connected to the floating line FL101 at node N1 located on part of the floating line FL101 on the signal output terminal SIG1 side of the ESD protection circuit 110.

The rectifier element D102 is provided so as to rectify in the direction in which to allow current to flow from the signal output terminal SIG2 to the floating line FL102. The rectifier element D102 is electrically connected between the signal output terminal SIG2 and the floating line FL102. The rectifier element D102 is, for example, a diode and has its cathode connected to the floating line FL102 and its anode connected to the signal line SL2. The rectifier element D102 is connected to the floating line FL102 at node N2 located on part of the floating line FL102 on the signal output terminal SIG2 side of the ESD protection circuit 150.

The floating line FL101 is not connected to any terminal of the output circuit 100, but is provided in a floating state. The floating line FL101 is a line whose potential is not fixed. The floating line FL101 is disposed alongside, and extending along, the signal line SL1. The rectifier element D101 and the ESD protection circuit 110 are connected to the floating line FL101.

The floating line FL102 is not connected to any terminal of the output circuit 100, but is provided in a floating state. The floating line FL102 is a line whose potential is not fixed. The floating line FL102 is disposed alongside, and extending along, the signal line SL2. The rectifier element D102 and the ESD protection circuit 150 are connected to the floating line FL102.

The ESD protection circuit 110 is provided between the floating line FL101 and the ground line GL. The ESD protection circuit 110 is electrically connected between the floating line FL101 and the ground line GL. When ESD current flows into the floating line FL101 via the rectifier element D101, the ESD protection circuit 110 connects the floating line FL101 to ground potential (ground line GL).

The ESD protection circuit 110 is an RCTMOS-type ESD protection circuit and has a trigger circuit 120, a buffer circuit 130, and a switch circuit 140. The trigger circuit 120 generates a trigger signal in response to ESD current flowing into the floating line FL101 via the rectifier element D101. The trigger circuit 120 has one end 120a connected to the floating line FL101 and the other end 120b connected to the ground line GL and has a series circuit of a resistor 121 and a capacitor 122 between the one end 120a and the other end 120b. A common connection node 123 of the resistor 121 and capacitor 122 forms the output end of the trigger circuit 120. Because the trigger circuit 120 has a time constant, the potential on the common connection node 123, that is, the level of the trigger signal gradually rises from a low (L) level to a high (H) level when ESD current flows into the floating line FL101 via the rectifier element D101.

The buffer circuit 130 receives the trigger signal from the trigger circuit 120 and generates a drive signal according to the trigger signal. The buffer circuit 130 has its input end 130a connected to the trigger circuit 120 and its output end 130b connected to the switch circuit 140 and has a series circuit of an odd number of (e.g., three) stages of inverters 131 to 133 between the input end 130a and the output end 130b. The inverter 131 to 133 of each stage is constituted by, e.g., a CMOS inverter in which a PMOS transistor and an NMOS transistor are connected in an inverter form, and the source of the PMOS transistor is connected to the floating line FL101, and the source of the NMOS transistor is connected to the ground line GL. If the level of the trigger signal is the L level, then the level of the drive signal output from the odd number of stages of inverters 131 to 133 is the H level. If the level of the trigger signal becomes the H level, then the level of the drive signal output from the odd number of stages of inverters 131 to 133 becomes the L level.

The switch circuit 140 receives the drive signal from the buffer circuit 130 and connects the floating line FL101 to ground potential (ground line GL) according to the drive signal. The switch circuit 140 has its input end 140a connected to the buffer circuit 130, its first output end 140b connected to the floating line FL101, and its second output end 140c connected to ground potential (ground line GL) and has an NMOS transistor (NMOS shunt transistor) 141 between the input end 140a, first output end 140b, and second output end 140c. The NMOS transistor 141 has its gate connected to the input end 140a, its drain connected to the first output end 140b, and its source connected to the second output end 140c. If the level of the drive signal received at the gate is the H level, then the NMOS transistor 141 turns on to connect the floating line FL101 to ground potential (ground line GL). If the level of the drive signal received at the gate becomes the L level, then the NMOS transistor 141 turns off to electrically cut the floating line FL101 off from ground potential (ground line GL).

In the ESD protection circuit 110, because the trigger signal of the L level of the trigger circuit 120 is driven by the odd number of stages of inverters 131 to 133 in the buffer circuit 130, the drive signal according to the trigger signal can be transmitted to the input end 140a (the gate of the NMOS transistor 141) of the switch circuit 140 at high speed. Thus, the switch circuit 140 can be turned on at high speed, so that the ESD protection circuit 110 can respond to ESD current at high speed and quickly respond also to high speed pulses like CDM currents as compared with the diode triggered thyristors 2, 10 (see FIG. 7).

The ESD protection circuit 150 is provided between the floating line FL102 and the ground line GL. The ESD protection circuit 150 is electrically connected between the floating line FL102 and the ground line GL. When ESD current flows into the floating line FL102 via the rectifier element D102, the ESD protection circuit 150 connects the floating line FL102 to ground potential (ground line GL).

The ESD protection circuit 150 is an RCTMOS-type ESD protection circuit and has a trigger circuit 160, a buffer circuit 170, and a switch circuit 180. The trigger circuit 160 generates a trigger signal in response to ESD current flowing into the floating line FL102 via the rectifier element D102. The trigger circuit 160 has one end 160a connected to the floating line FL102 and the other end 160b connected to the ground line GL and has a series circuit of a resistor 161 and a capacitor 162 between the one end 160a and the other end 160b. A common connection node 163 of the resistor 161 and capacitor 162 forms the output end of the trigger circuit 160. Because the trigger circuit 160 has a time constant, the potential on the common connection node 163, that is, the level of the trigger signal gradually rises from the L level to the H level when ESD current flows into the floating line FL102 via the rectifier element D102.

The buffer circuit 170 receives the trigger signal from the trigger circuit 160 and generates a drive signal according to the trigger signal. The buffer circuit 170 has its input end 170a connected to the trigger circuit 160 and its output end 170b connected to the switch circuit 180 and has a series circuit of an odd number of (e.g., three) stages of inverters 171 to 173 between the input end 170a and the output end 170b. The inverter 171 to 173 of each stage is constituted by, e.g., a CMOS inverter in which a PMOS transistor and an NMOS transistor are connected in an inverter form, and the source of the PMOS transistor is connected to the floating line FL102, and the source of the NMOS transistor is connected to the ground line GL. If the level of the trigger signal is the L level, then the level of the drive signal output from the odd number of stages of inverters 171 to 173 is the H level. If the level of the trigger signal becomes the H level, then the level of the drive signal output from the odd number of stages of inverters 171 to 173 becomes the L level.

The switch circuit 180 receives the drive signal from the buffer circuit 170 and connects the floating line FL102 to ground potential (ground line GL) according to the drive signal. The switch circuit 180 has its input end 180a connected to the buffer circuit 170, its first output end 180b connected to the floating line FL102, and its second output end 180c connected to ground potential (ground line GL) and has an NMOS transistor (NMOS shunt transistor) 181 between the input end 180a, first output end 180b, and second output end 180c. The NMOS transistor 181 has its gate connected to the input end 180a, its drain connected to the first output end 180b, and its source connected to the second output end 180c. If the level of the drive signal received at the gate is the H level, then the NMOS transistor 181 turns on to connect the floating line FL102 to ground potential (ground line GL). If the level of the drive signal received at the gate becomes the L level, then the NMOS transistor 181 turns off to electrically cut the floating line FL102 off from ground potential (ground line GL).

In the ESD protection circuit 150, because the trigger signal of the L level of the trigger circuit 160 is driven by the odd number of stages of inverters 171 to 173 in the buffer circuit 170, the drive signal according to the trigger signal can be transmitted to the input end 180a (the gate of the NMOS transistor 181) of the switch circuit 180 at high speed. Thus, the switch circuit 180 can be turned on at high speed, so that the ESD protection circuit 150 can respond to ESD current at high speed and quickly respond also to high speed pulses like CDM currents as compared with the diode triggered thyristors 2, 50 (see FIG. 7).

Figure 2:
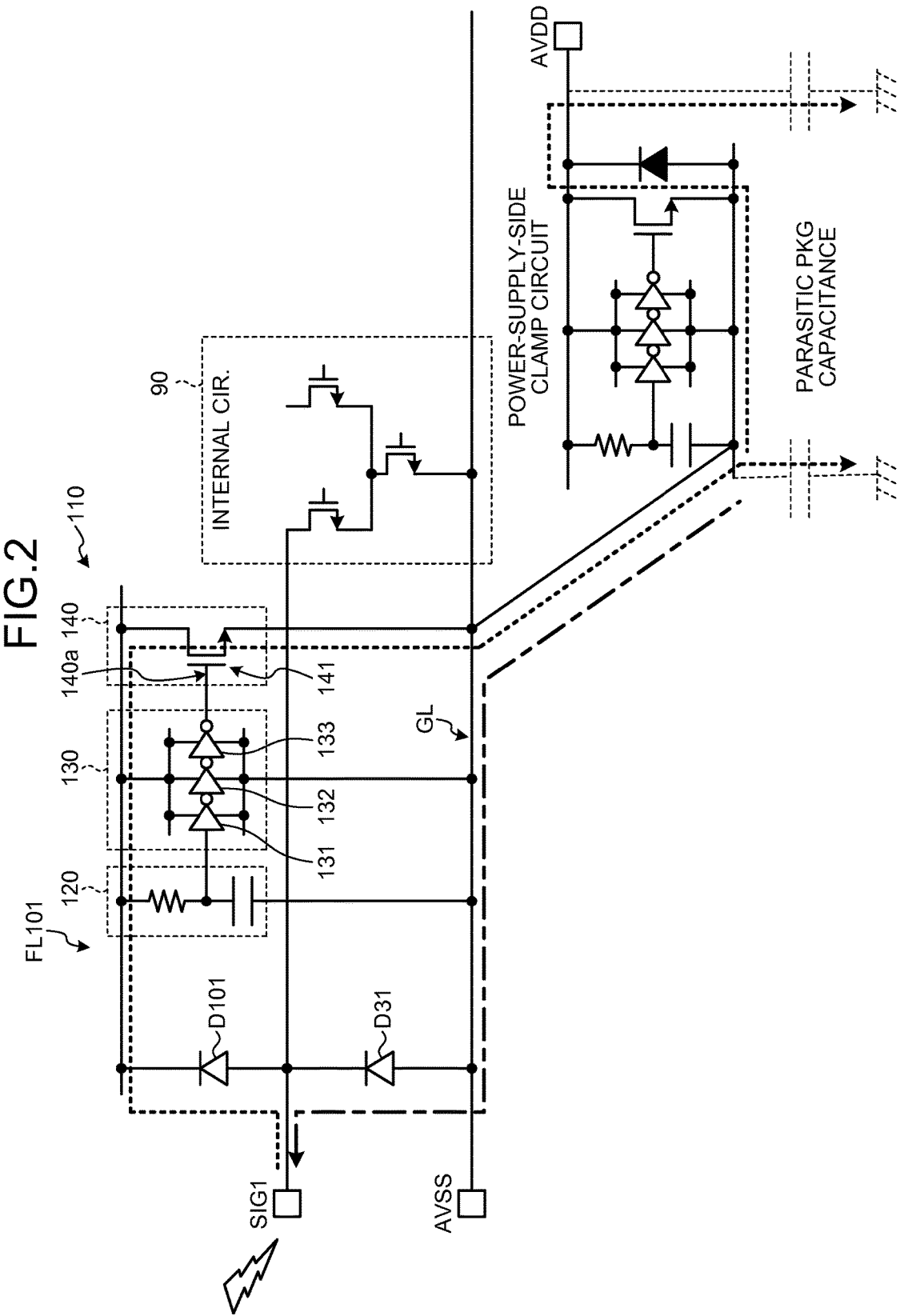
FIG. 2 is a diagram showing an operation of the output circuit according to the embodiment.
Figure 3:
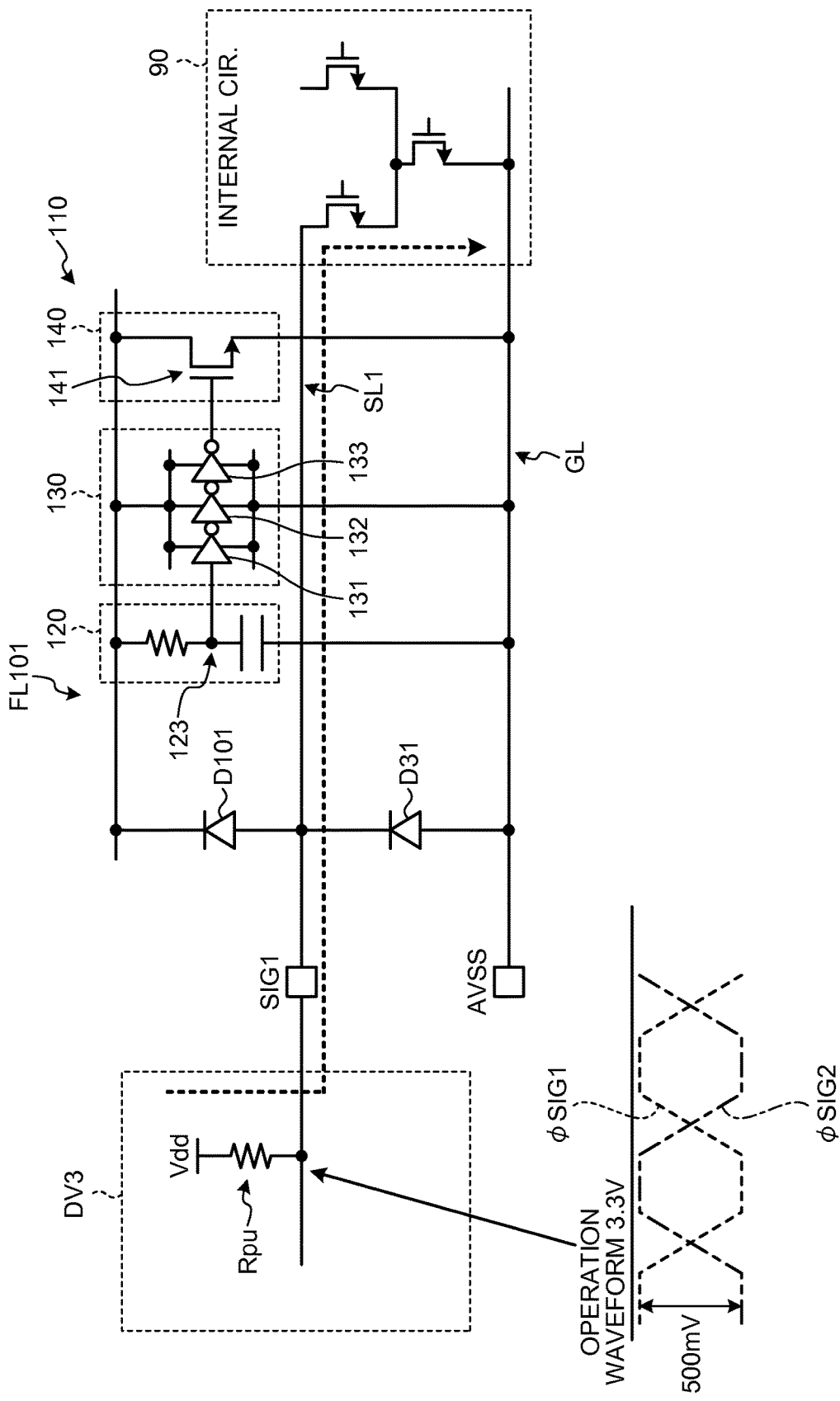
FIG. 3 is a diagram showing an operation of the output circuit according to the embodiment.

Next, the operation of the output circuit 100 will be described using FIGS. 2 and 3. FIG. 2 is a diagram showing the operation of the output circuit 100 when ESD current flows into the floating line FL101. FIG. 3 is a diagram showing the operation of the output circuit 100 when the device DV1 outputs a signal to the output-destination device DV3 (in normal operation). Although FIGS. 2, 3 illustratively show the operation of the signal output terminal SIG1 side, the same applies to the operation of the signal output terminal SIG2 side.

As shown in FIG. 2, when ESD current (e.g., CDM current) goes into the output circuit 100 via the signal output terminal SIG1, if the ESD current flows into the floating line FL101 via the rectifier element D101, the ESD protection circuit 110 can respond to it at high speed.

That is, in the ESD protection circuit 110, because the trigger signal of the L level of the trigger circuit 120 is driven by the odd number of stages of inverters 131 to 133 in the buffer circuit 130, the drive signal according to the trigger signal can be transmitted to the input end 140a (the gate of the NMOS transistor 141) of the switch circuit 140 at high speed. Thus, the switch circuit 140 can be turned on at high speed, so that the ESD protection circuit 110 can respond to ESD current (e.g., CDM current) at high speed with securing a discharge path for the ESD current (e.g., CDM current).

That is, as indicated by a dotted line in FIG. 2, positive ESD current (e.g., CDM current) flows from the signal output terminal SIG1 through the rectifier element D101, the floating line FL101, and the ESD protection circuit 110 into the ground line GL, and is discharged into ground potential via a parasitic package capacitance equivalently connected to the ground line GL. Or the ESD current is discharged through a clamp circuit on the for-low-voltage power supply terminal AVDD side into ground potential via a parasitic package capacitance equivalently connected to the power supply terminal AVDD.

It should be noted that, as indicated by a dot-dashed line in FIG. 2, negative ESD current flows from ground potential through the parasitic package capacitance, the ground line GL, and the rectifier element D31 out via the signal output terminal SIG1. Thus, the negative ESD current is discharged into ground potential.

As shown in FIG. 3, where the output-destination device DV3 is connected to the device DV1, the positive phase terminal (see FIG. 7) of the output-destination device DV3 is connected to the signal output terminal SIG1. That is, because a power supply potential Vdd (e.g., 3.3 V) is connected to the signal output terminal SIG1 via a pull-up resistor Rpu, a potential corresponding to the power supply potential Vdd is transmitted to the floating line FL101 via the rectifier element D101. For example, if the rectifier element D101 is a diode and the ON voltage of the diode is 0.7 V, the floating line FL101 is charged such that the potential thereon becomes 3.3 V−0.7 V=2.6 V.

At this time, the potential on the common connection node 123 of the trigger circuit 120 gradually rises from the L level to the H level, and after enough time corresponding to the time constant of the trigger circuit 120 elapses, the potential on the common connection node 123, that is, the level of the trigger signal is at the H level and stable. If the level of the trigger signal becomes the H level, then the level of the drive signal output from the odd number of stages of inverters 131 to 133 in the buffer circuit 130 becomes the L level. When the level of the drive signal received at the gate becomes the L level, then the NMOS transistor 141 of the switch circuit 140 turns off to electrically cut the floating line FL101 off from ground potential (ground line GL). Thus, the floating line FL101 can be easily charged such that the potential thereon becomes, e.g., 2.6 V, and hence the potential thereon can be easily made stable.

Therefore, as indicated by a broken line in FIG. 3, a current according to a signal can be made to flow from the power supply potential Vdd of the output-destination device DV3 through the signal output terminal SIG1 and the signal line SL1 into the internal circuit 90. That is, because the potential on the floating line FL101 can be easily made stable, as indicated as an operation waveform by a broken line in FIG. 3, a signal φSIG1 can be stably output from the internal circuit 90 via the signal output terminal SIG1 to the output-destination device DV3.

It should be noted that, because the potential on the floating line FL102 can be easily made stable likewise, as indicated as an operation waveform by a dot-dashed line in FIG. 3, a signal φSIG2 can be stably output from the internal circuit 90 via the signal output terminal SIG2 to the output-destination device DV3. FIG. 3 illustratively shows, as the signals φSIG1, φSIG2 forming a differential pair, a signal pair which varies with an amplitude of 500 mV with respect to 3.3 V.

As described above, in the present embodiment, in the output circuit 100, the ESD protection circuit 110 connects the floating line FL101 to ground potential when ESD current flows into the floating line FL101 via the rectifier element D101. Thus, a discharge path for the ESD current which bypasses the signal line SL1 can be secured, so that the internal circuit 90 can be protected against ESD current.

In the present embodiment, in the ESD protection circuit 110, the trigger circuit 120 generates a trigger signal in response to ESD current flowing into the floating line FL101 via the rectifier element D101. The buffer circuit 130 generates a drive signal according to the trigger signal generated by the trigger circuit 120. The switch circuit 140 connects the floating line FL101 to ground potential according to the drive signal generated by the buffer circuit 130. At this time, because the buffer circuit 130 drives the trigger signal, the drive signal according to the trigger signal can be transmitted to the switch circuit 140 at high speed. Thus, the switch circuit 140 can be turned on at high speed, so that the ESD protection circuit 110 can respond to ESD current at high speed and quickly respond also to high speed pulses like CDM currents as compared with the diode triggered thyristors 2, 10 (see FIG. 7).

Further, in the present embodiment, in the output circuit 100, the rectifier elements D101 is connected between the signal line SL1 and the floating line FL101, and the rectifier elements D102 is connected between the signal line SL2 and the floating line FL102. Thus, as compared with the case of protection against ESD by the diode triggered thyristors 10, 50 (see FIG. 7), the parasitic capacitance of the rectifier element D101 when seen from the signal line SL1 can be greatly reduced, and the parasitic capacitance of the rectifier element D102 when seen from the signal line SL2 can be greatly reduced. As a result, the transmission delay of a signal on the signal line SL1 can be greatly reduced, and the transmission delay of a signal on the signal line SL2 can be greatly reduced, so that the transmission speed of a differential signal across the signal lines SL1 and SL2 can be easily secured. For example, even for signals of 1 GHz or higher, a reduction in attenuation can be achieved.

Yet further, in the present embodiment, in the output circuit 100, the ESD protection circuit 110 electrically disconnects the floating line FL101 from ground potential (ground line GL) in normal operation. Thus, when the power supply potential Vdd is connected to the signal output terminal SIG1 via the pull-up resistor Rpu, so that a potential corresponding to the power supply potential Vdd is transmitted to the floating line FL101 via the rectifier element D101, the floating line FL101 can be easily charged so as to make the potential thereon be at a predetermined potential and stable. Therefore, the influence of the floating line FL101 on the intrinsic operation of the differential output circuit can be suppressed, and the signal φSIG1 can be stably output from the internal circuit 90 via the signal output terminal SIG1 to the output-destination device DV3.

Figure 4:
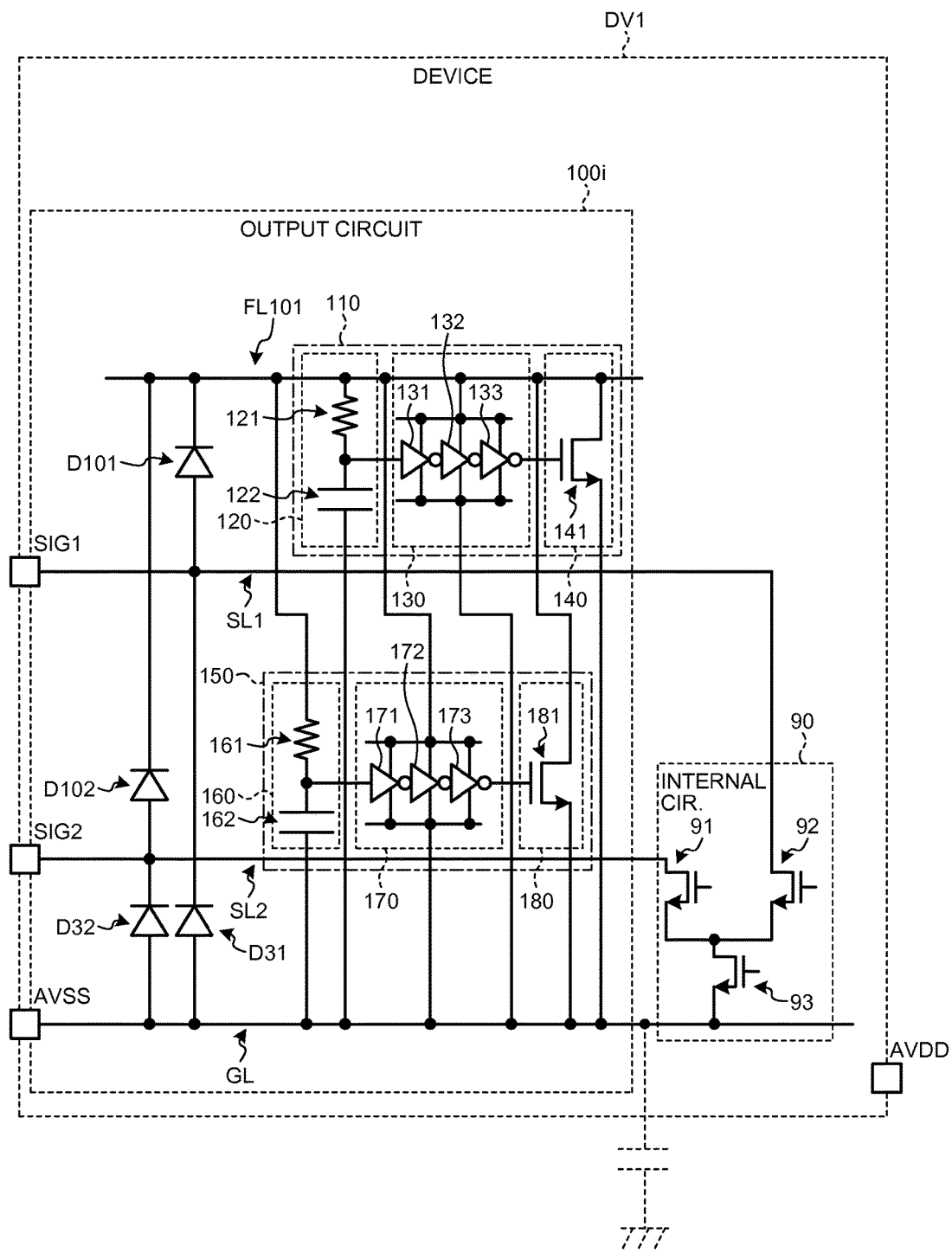
FIG. 4 is a diagram showing the configuration of an output circuit according to a variant of the embodiment.

It should be noted that, as shown in FIG. 4, in an output circuit 100i, one of the floating lines FL101 and FL102 (see FIG. 1) may be made common to the signal output terminals SIG1 and SIG2. Although FIG. 4 illustratively shows the case where the floating line FL101 of the floating lines FL101 and FL102 is made common with the other being omitted, instead, the floating line FL102 of the floating lines FL101 and FL102 may be made common with the other being omitted. In this case, as the number of floating lines decreases, correspondingly the layout area (chip area) of the output circuit 100i can be reduced, so that the cost of the output circuit 100i can be reduced.

Figure 5:
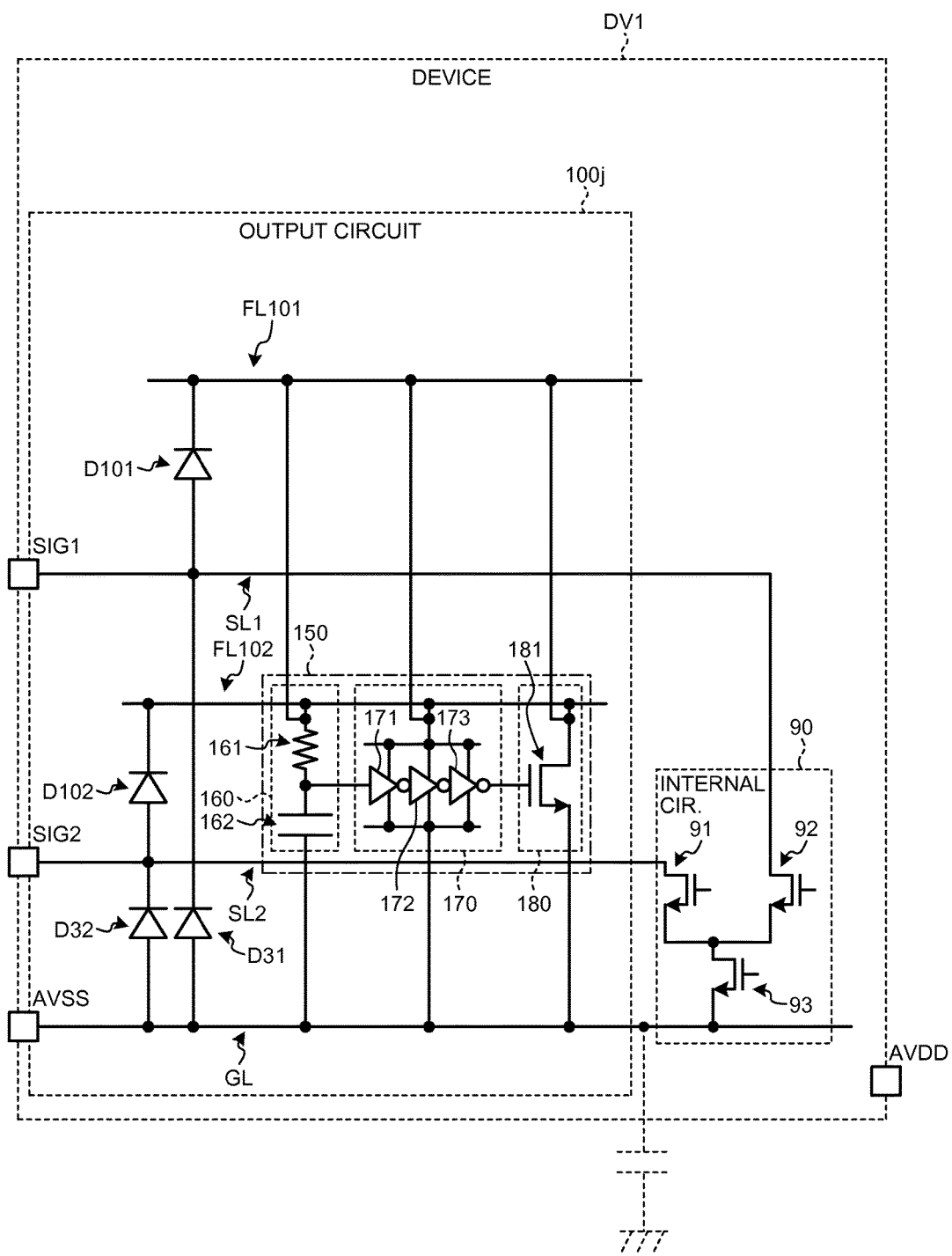
FIG. 5 is a diagram showing the configuration of an output circuit according to another variant of the embodiment.

Or, as shown in FIG. 5, in an output circuit 100j, one of the ESD protection circuit 110 (see FIG. 1) and the ESD protection circuit 150 may be made common to the signal output terminals SIG1 and SIG2. Although FIG. 5 illustratively shows the case where the ESD protection circuit 150 of the ESD protection circuits 110 and 150 is made common with the other being omitted, instead, the ESD protection circuit 110 of the ESD protection circuits 110 and 150 may be made common with the other being omitted. In this case, as the number of ESD protection circuits decreases, correspondingly the circuit size and layout area (chip area) of the output circuit 100j can be reduced, so that the cost of the output circuit 100j can be reduced.

Figure 6:
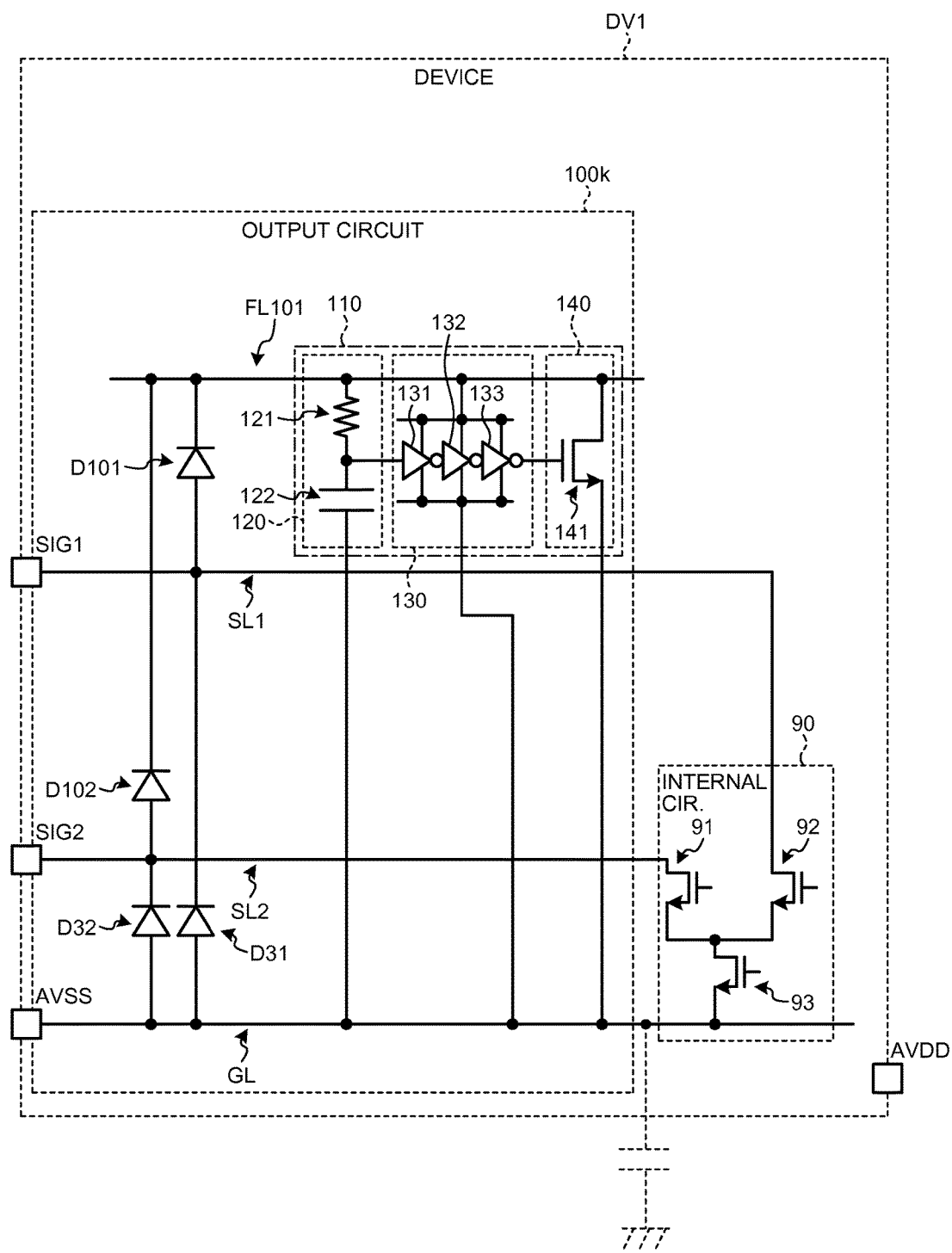
FIG. 6 is a diagram showing the configuration of an output circuit according to yet another variant of the embodiment.

Or, as shown in FIG. 6, in an output circuit 100k, one of the floating lines FL101 and FL102 (see FIG. 1) may be made common to the signal output terminals SIG1 and SIG2, and also one of the ESD protection circuit 110 and the ESD protection circuit 150 (see FIG. 1) may be made common to the signal output terminals SIG1 and SIG2. Although FIG. 6 illustratively shows the case where the floating line FL101 of the floating lines FL101 and FL102 is made common with the other being omitted and where the ESD protection circuit 110 of the ESD protection circuits 110 and 150 is made common with the other being omitted, in a way other than this, they can be made common. For example, the floating line FL101 of the floating lines FL101 and FL102 may be made common with the other being omitted, and the ESD protection circuit 150 of the ESD protection circuits 110 and 150 may be made common with the other being omitted. For example, the floating line FL102 of the floating lines FL101 and FL102 may be made common with the other being omitted, and the ESD protection circuit 110 of the ESD protection circuits 110 and 150 may be made common with the other being omitted. For example, the floating line FL102 of the floating lines FL101 and FL102 may be made common with the other being omitted, and the ESD protection circuit 150 of the ESD protection circuits 110 and 150 may be made common with the other being omitted. In this case, as the number of floating lines decreases and the number of ESD protection circuits decreases, correspondingly the circuit size and layout area (chip area) of the output circuit 100k can be reduced, so that the cost of the output circuit 100k can be reduced.

Although the case where the ESD protection circuits 110 and 150 are RCTMOS-type ESD protection circuits is illustratively described above, another type of ESD protection circuits may be used as long as they can operate at such a speed as to follow the rising in the waveform of CDM current (a high speed pulse).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An open-drain-type output circuit which outputs a signal of an internal circuit, comprising:
   a first signal output terminal;
   a first signal line that connects the first signal output terminal and the internal circuit;
   a first floating line whose potential is not fixed;
   a first rectifier element connected between the first signal output terminal and the first floating line; and
   a first ESD protection circuit connected between the first floating line and ground potential, the first ESD protection circuit having a trigger circuit, a buffer circuit, and a switch circuit, the trigger circuit having one end connected to the first floating line and another end connected to the ground potential, the trigger circuit having a series circuit of a resistor and a capacitor between the one end and the other end, a common connection node of the resistor and the capacitor forming an output end of the trigger circuit, the buffer circuit being connected to the trigger circuit, the switch circuit having a first node, a second node, and a third node, the first node being connected to the buffer circuit, the second node being connected to the first floating line, the third node being connected to the ground potential.

2. The output circuit according to claim 1, wherein the first rectifier element includes a first diode, cathode of the first diode being connected to the first floating line, anode of the first diode being connected to the first signal line.

3. The output circuit according to claim 1, wherein the first floating line is disposed alongside, and extending along, the first signal line.

4. The output circuit according to claim 1, further comprising:
   a ground terminal; and
   a ground line connected to the ground terminal,
   wherein the first ESD protection circuit is connected between the first floating line and the ground line.

5. The output circuit according to claim 1, wherein the first ESD protection circuit is an ESD protection circuit configured to operate at such a speed as to follow a rising rate in a waveform of a surge current in a CDM (Charged Device Model).

6. The output circuit according to claim 1, wherein in the series circuit the resistor is arranged on a side of the first floating line and the capacitor is arranged on a side of the ground potential.

7. The output circuit according to claim 1, wherein the buffer circuit includes an odd number of stages of inverters.

8. The output circuit according to claim 7, wherein the trigger circuit generates the trigger signal whose level gradually rises from a low (L) level to a high (H) level, and
wherein the buffer circuit drives the generated trigger signal by the odd number of stages of inverters to transmit to an input end of the switch circuit.

9. The output circuit according to claim 8, wherein in the series circuit the resistor is arranged on a side of the first floating line and the capacitor is arranged on a side of the ground potential.

10. The output circuit according to claim 8, wherein the switch circuit has a NMOS transistor, a gate of the NMOS transistor being connected to an output of the buffer circuit, a drain of the NMOS transistor being connected to the first floating line, and a source of the NMOS transistor being connected to the ground potential.

11. The output circuit according to claim 1, wherein output side of the first ESD protection circuit electrically bypass the first signal line to be connected to the ground potential.

12. The output circuit according to claim 1, further comprising:
a second signal output terminal;
a second signal line that connects the second signal output terminal and the internal circuit;
a second floating line whose potential is not fixed;
a second rectifier element connected between the second signal output terminal and the second floating line; and
a second ESD protection circuit connected between the second floating line and the ground potential.

13. The output circuit according to claim 12, wherein the second rectifier element includes a second diode, cathode of the second diode being connected to the second floating line, anode of the second diode being connected to the second signal line.

14. The output circuit according to claim 12, wherein the second floating line is disposed alongside, and extending along, the second signal line.

15. The output circuit according to claim 1, further comprising:
a second signal output terminal;
a second signal line that connects the second signal output terminal and the internal circuit;
a second rectifier element connected between the second signal output terminal and the first floating line; and
a second ESD protection circuit connected between the first floating line and ground potential.

16. The output circuit according to claim 1, further comprising:
a second signal output terminal;
a second signal line that connects the second signal output terminal and the internal circuit;
a second floating line whose potential is not fixed; and
a second rectifier element connected between the second signal output terminal and the second floating line,
wherein the first ESD protection circuit is connected between the second floating line and ground potential.

17. The output circuit according to claim 1, further comprising:
a second signal output terminal;
a second signal line that connects the second signal output terminal and the internal circuit; and
a second rectifier element connected to the second signal output terminal and the first floating line.

18. The output circuit according to claim 1, further comprising:
a ground terminal;
a ground line connected to the ground terminal; and
a third rectifier element connected between the ground line and the first signal output terminal.

19. The output circuit according to claim 12, further comprising:
a ground terminal;
a ground line connected to the ground terminal;
a third rectifier element connected between the ground line and the first signal output terminal; and
a fourth rectifier element connected between the ground line and the second signal output terminal.

* * * * *